US010329144B2

(12) United States Patent
Muramatsu et al.

(10) Patent No.: US 10,329,144 B2
(45) Date of Patent: Jun. 25, 2019

(54) SUBSTRATE TREATMENT METHOD, COMPUTER STORAGE MEDIUM AND SUBSTRATE TREATMENT SYSTEM

(71) Applicant: Tokyo Electron Limited, Tokyo (JP)

(72) Inventors: Makoto Muramatsu, Koshi (JP); Tadatoshi Tomita, Koshi (JP); Hisashi Genjima, Koshi (JP); Gen You, Koshi (JP); Takahiro Kitano, Tokyo (JP); Takanori Nishi, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 15/554,026

(22) PCT Filed: Feb. 10, 2016

(86) PCT No.: PCT/JP2016/053988
§ 371 (c)(1),
(2) Date: Aug. 28, 2017

(87) PCT Pub. No.: WO2016/140031
PCT Pub. Date: Sep. 9, 2016

(65) Prior Publication Data
US 2018/0065843 A1   Mar. 8, 2018

(30) Foreign Application Priority Data

Mar. 5, 2015   (JP) .............................. 2015-043551

(51) Int. Cl.
*C03C 15/00*     (2006.01)
*B81C 1/00*      (2006.01)
(Continued)

(52) U.S. Cl.
CPC ...... *B81C 1/00031* (2013.01); *B81C 1/00428* (2013.01); *B82Y 40/00* (2013.01);
(Continued)

(58) Field of Classification Search
CPC ............. H01L 21/0337; H01L 21/0271; H01L 2224/0352; H01L 2224/82108; H01L 2224/83888; B81C 1/00428
(Continued)

(56) References Cited

U.S. PATENT DOCUMENTS

2013/0244439 A1* 9/2013 Ghariehali .......... H01L 21/3081
                                                      438/703
2015/0228512 A1* 8/2015 Muramatsu .......... G03F 7/0002
                                                      438/694
(Continued)

FOREIGN PATENT DOCUMENTS

JP   2007-313568 A    12/2007
TW       201426845     7/2014
WO   2014/038420 A1    3/2014

OTHER PUBLICATIONS

International Search Report of the International Searching Authority dated Apr. 19, 2016 in corresponding international application No. PCT/JP2016/053988 (and English translation).

*Primary Examiner* — Binh X Tran
(74) *Attorney, Agent, or Firm* — Posz Law Group, PLC

(57) ABSTRACT

A substrate treatment method using a block copolymer containing a hydrophilic polymer and a hydrophobic polymer includes a polymer separating step, wherein a ratio of a molecular weight of the hydrophilic polymer in the block copolymer is adjusted to 20% to 40% so that the hydrophilic polymers align at positions corresponding to a hexagonal close-packed structure in a plan view after the polymer separating step, and at the polymer separating step, a columnar first hydrophilic polymer is phase-separated on each of circular patterns of hydrophobic coating films and a columnar second hydrophilic polymer is phase-separated between the first hydrophilic polymers, and a diameter of the circular pattern is set so that the first hydrophilic polymers and the (Continued)

second hydrophilic polymers align at positions corresponding to the hexagonal close-packed structure in a plan view.

12 Claims, 11 Drawing Sheets

(51) Int. Cl.
  *B82Y 40/00* (2011.01)
  *C08F 297/00* (2006.01)
  *H01L 21/027* (2006.01)
  *H01L 21/033* (2006.01)
  *H01L 21/67* (2006.01)
  *H01L 21/677* (2006.01)

(52) U.S. Cl.
  CPC ........ *C08F 297/00* (2013.01); *H01L 21/0271* (2013.01); *H01L 21/0337* (2013.01); *H01L 21/67178* (2013.01); *H01L 21/67742* (2013.01); *B81C 2201/0149* (2013.01)

(58) Field of Classification Search
  USPC ........................................ 216/41, 46, 47, 49
  See application file for complete search history.

(56) References Cited

U.S. PATENT DOCUMENTS

| | | | | |
|---|---|---|---|---|
| 2015/0243525 | A1* | 8/2015 | Park | H01L 21/31144 438/703 |
| 2015/0380266 | A1* | 12/2015 | Wuister | G03F 7/0002 257/622 |
| 2016/0122580 | A1* | 5/2016 | Hong | C09D 153/00 216/95 |
| 2016/0178999 | A1* | 6/2016 | Wuister | G03F 1/70 716/51 |
| 2016/0266486 | A1* | 9/2016 | Wuister | G03F 7/0002 |

\* cited by examiner

SUBSTRATE TREATMENT METHOD, COMPUTER STORAGE MEDIUM AND SUBSTRATE TREATMENT SYSTEM

CROSS REFERENCE TO RELATED APPLICATIONS

This application is based upon and claims the benefit of priority of the prior Japanese Patent Application No. 2015-043551, filed in Japan on Mar. 5, 2015, the entire contents of which are incorporated herein by reference.

TECHNICAL FIELD

The present invention relates to a substrate treatment method, a computer-readable storage medium and a substrate treatment system, using a block copolymer containing a hydrophilic (polar) polymer having a hydrophilic property (polarity) and a hydrophobic (nonpolar) polymer having a hydrophobic property (no polarity).

BACKGROUND ART

For example, in a manufacturing process of a semiconductor device, photolithography processing is performed in which a resist coating treatment of applying a resist solution onto, for example, a semiconductor wafer (hereinafter, referred to as a "wafer") as a substrate to form a resist film, exposure processing of exposing the resist film to a predetermined pattern, a developing treatment of developing the exposed resist film and so on are performed in sequence to form a predetermined resist pattern on the wafer. Then, using the resist pattern as a mask, an etching treatment is performed on a film to be treated on the wafer and a removal treatment of the resist film is then performed, to form a predetermined pattern in the film to be treated.

Incidentally, to increase the capacitance such as DRAM, higher density of holes patterns constituting a capacitor in the DRAM is required. For this end, the resist pattern is increasingly miniaturized and, for example, the wavelength of light for the exposure processing in the photolithography processing is increasingly shortened. However, it is now difficult to form a fine resist pattern at a level of, for example, several nanometers only by the method of increasingly reducing the wavelength of light because there are limits in technique and cost for shortening the light source of exposure.

Hence, there is a proposed wafer treatment method using a block copolymer composed of a polymer having a hydrophilic property (hydrophilic polymer) and a polymer having a hydrophobic property (hydrophobic polymer) (Patent Document 1). In this method, for example, hole patterns are formed on the wafer at positions corresponding to a hexagonal close-packed structure in a plan view. More specifically, circular patterns are formed of the film having hydrophilic property as a base at some of the positions corresponding to the hexagonal close-packed structure on the wafer, and the block copolymer is applied onto the wafer after pattern formation. Then, when the block copolymer is phase-separated into the hydrophilic polymer and the hydrophobic polymer, the circular patterns having hydrophilic property formed as the base function as guides, and columnar hydrophilic polymers align to be in contact with the upper surfaces of the patterns. In addition to the above, hydrophilic polymers autonomously and regularly align in sequence at positions corresponding to the hexagonal close-packed structure from the columnar hydrophilic polymers as starting points.

Thereafter, for example, the hydrophilic polymers are removed, whereby fine hole patterns are formed of the hydrophobic polymer on the wafer. Then, an etching treatment is performed on a film to be treated using the patterns of the hydrophobic polymers as a mask, whereby a predetermined pattern is formed in the film to be treated.

PRIOR ART DOCUMENT

Patent Document

[Patent Document 1] Japanese Laid-open Patent Publication No. 2007-313568

DISCLOSURE OF THE INVENTION

Problems to be Solved by the Invention

However, for example, in the case of using the circle patterns formed of the film having the hydrophilic property as guides, if the diameter of the guide is deviated by several nanometers from a desired value, the columnar hydrophilic polymers do not appropriately align any longer at the positions corresponding to the hexagonal close-packed structure. Therefore, the method in Patent Document 1 needs to control the diameter of the guide at an accuracy of several nanometers and has a problem of extremely small process margin.

The present invention has been made in consideration of the points, and its object is to appropriately form a predetermined pattern on a substrate in a substrate treatment using a block copolymer containing a hydrophilic polymer and a hydrophobic polymer.

Means for Solving the Problems

To achieve the above object, one aspect of the present invention is a method of treating a substrate using a block copolymer containing a hydrophilic polymer and a hydrophobic polymer, including: a neutral layer forming step of forming a neutral layer on the substrate; a coating film pattern forming step of forming a plurality of circular patterns of hydrophobic coating films at predetermined positions on the substrate after the neutral layer forming step; a block copolymer coating step of applying the block copolymer onto the substrate on which the patterns of the coating films are formed; a polymer separating step of phase-separating the block copolymer into the hydrophilic polymer and the hydrophobic polymer; and a polymer removing step of selectively removing the hydrophilic polymer from the phase-separated block copolymer. Further, a ratio of a molecular weight of the hydrophilic polymer in the block copolymer is adjusted to 20% to 40% so that the hydrophilic polymers align at positions corresponding to a hexagonal close-packed structure in a plan view after the polymer separating step, and at the polymer separating step, a columnar first hydrophilic polymer is phase-separated on each of the circular patterns of the hydrophobic coating films and a columnar second hydrophilic polymer is phase-separated between the first hydrophilic polymers, and a diameter of the circular pattern of the hydrophobic coating film is set to $2(L_0-R)$ or less so that the first hydrophilic polymers and the second hydrophilic polymers align at the positions corresponding to the hexagonal close-packed structure in a plan view, where $L_0$: a pitch between the first hydrophilic polymer and the second hydrophilic polymer adjacent to each other, and R: a radius of the second hydrophilic polymer.

In the pattern formation using the block copolymer, generally, a guide is formed, on a base, using a film having a small energy difference with respect to the polymer whose arrangement is desired to be controlled of the hydrophilic polymer and the hydrophobic polymer, and the block copolymer applied thereon is phase-separated to autonomously align the polymer at a position corresponding to the guide. On the other hand, the present inventors has obtained knowledge that the arrangement of the polymer can be controlled also by forming the guide of a film having a large energy difference with respect to the polymer desired to be arranged. Specifically, it has been found that, for example, in the case of controlling the arrangement of the columnar hydrophilic polymer, when a circular guide is formed of a film having a large energy difference with respect to the hydrophilic polymer that is the polymer desired to be arranged, namely, a hydrophobic film, the hydrophobic polymer is drawn to above the guide, but the hydrophilic polymer exists at a certain proportion in the block copolymer, so that the hydrophilic polymer autonomously aligns at the center portion of a region to which the hydrophobic polymer is drawn.

The present invention is based on the knowledge, and a circular pattern of a hydrophobic coating film is formed at a predetermined position on the substrate, a block copolymer having a molecular weight of the hydrophilic polymer adjusted to a predetermined ratio is applied on the circular pattern, and then the block copolymer is phase-separated. As a result, a columnar hydrophilic polymer autonomously aligns at the position corresponding to the center of the circular pattern of the hydrophobic coating film. In this method, the diameter of the circular pattern of the hydrophobic polymer is set to a predetermined value or less, thereby making it possible to align the second hydrophilic polymers at positions corresponding to the hexagonal close-packed structure in a plan view. Therefore, forming the circular patterns of the hydrophobic coating films at appropriate positions makes it possible to form desired patterns, namely, patterns that the first hydrophilic polymers and the second hydrophilic polymers align at the positions corresponding to the hexagonal close-packed structure. Further, in the present invention, the diameter of the circular pattern of the hydrophobic coating film only needs to be set to $2(L_0-R)$ or less, where the pitch between the first hydrophilic polymer and the second hydrophilic polymer adjacent to each other is $L_0$ and the radius of the second hydrophilic polymer is R, in which it is possible to ensure an extremely large process margin as compared with the case of using the hydrophilic film to control the arrangement of the columnar hydrophilic polymer as in Patent Document 1. Therefore, according to the present invention, in a substrate treatment using a block copolymer containing a hydrophilic polymer and a hydrophobic polymer, a predetermined pattern can be appropriately formed on the substrate.

An aspect of the present invention according to another viewpoint is a method of treating a substrate using a block copolymer containing a hydrophilic polymer and a hydrophobic polymer, including: a neutral layer forming step of forming a neutral layer on the substrate; a coating film pattern forming step of forming a plurality of circular patterns of hydrophobic coating films at predetermined positions on the substrate after the neutral layer forming step; a block copolymer coating step of applying the block copolymer onto the substrate on which the patterns of the coating films are formed; a polymer separating step of phase-separating the block copolymer into the hydrophilic polymer and the hydrophobic polymer; and a polymer removing step of selectively removing the hydrophilic polymer from the phase-separated block copolymer, wherein a ratio of a molecular weight of the hydrophilic polymer in the block copolymer is adjusted to 20% to 40% so that the hydrophilic polymers align at positions corresponding to a hexagonal close-packed structure in a plan view after the polymer separating step, and the circular pattern formed at the coating film pattern forming step is decided based on following (1) to (3):

(1) a diameter of the circular pattern is 0.8 to 1.5 times a desired pitch between the hydrophilic polymers aligning after the polymer separating step;

(2) a distance between closest adjacent circular patterns is twice the desired pitch; and (3) at least one of the circular patterns is arranged on a circumference having a radius of $2\sqrt{3}$ times the desired pitch around the circular pattern.

An aspect of the present invention according to still another viewpoint is a method of treating a substrate using a block copolymer containing a hydrophilic polymer and a hydrophobic polymer, including: a neutral layer forming step of forming a neutral layer on the substrate; a coating film pattern forming step of forming a plurality of circular patterns of hydrophobic coating films at predetermined positions on the substrate after the neutral layer forming step; a block copolymer coating step of applying the block copolymer onto the substrate on which the patterns of the coating films are formed; a polymer separating step of phase-separating the block copolymer into the hydrophilic polymer and the hydrophobic polymer; and a polymer removing step of selectively removing the hydrophilic polymer from the phase-separated block copolymer. Further, a ratio of a molecular weight of the hydrophilic polymer in the block copolymer is adjusted to 20% to 40% so that the hydrophilic polymers align at positions corresponding to a hexagonal close-packed structure in a plan view after the polymer separating step, and the circular patterns formed at the coating film pattern forming step are arranged in an equilateral triangle shape having a pitch twice a desired pitch between the hydrophilic polymers aligning after the polymer separating step.

An aspect of the present invention according to another viewpoint is a computer-readable storage medium storing a program running on a computer of a control unit configured to control a substrate treatment system to cause the substrate treatment system to execute each of the above-described substrate treatment methods.

An aspect of the present invention according to yet another viewpoint is a substrate treatment system for treating a substrate using a block copolymer containing a hydrophilic polymer and a hydrophobic polymer, including: a resist coating apparatus which applies a resist film onto the substrate; a developing treatment apparatus which develops the resist film after exposure processing formed on the substrate to form a resist pattern; a coating film forming apparatus which forms a hydrophobic coating film to the substrate after formation of the resist pattern; a resist removing apparatus which removes the resist pattern from the substrate after formation of the coating film; a block copolymer coating apparatus which applies a block copolymer to the substrate after removal of the resist pattern; a polymer separation apparatus which phase-separates the block copolymer into the hydrophilic polymer and the hydrophobic polymer; and a polymer removing apparatus which selectively removes the hydrophilic polymer from the phase-separated block copolymer. Further, a ratio of a molecular weight of the hydrophilic polymer in the block copolymer applied in the block copolymer coating apparatus is adjusted so that the hydrophilic polymers align at positions corresponding to a hexagonal close-packed structure in a plan view after phase separation in the polymer separation apparatus, and a pattern formed of the coating film is a circular pattern, and the circular pattern is decided based on following (1) to (3):

(1) a diameter of the circular pattern is 0.8 to 1.5 times a desired pitch between the hydrophilic polymers aligning after the phase separation in the polymer separation apparatus;

(2) a distance between closest adjacent circular patterns is twice the desired pitch; and (3) at least one of the circular patterns is arranged on a circumference having a radius of $2\sqrt{3}$ times the desired pitch around the circular pattern.

EFFECT OF THE INVENTION

According to the present invention, it is possible to appropriately form a predetermined pattern on a substrate in a substrate treatment using a block copolymer containing a hydrophilic polymer and a hydrophobic polymer.

EMBODIMENT FOR CARRYING OUT THE INVENTION

Figure 1:
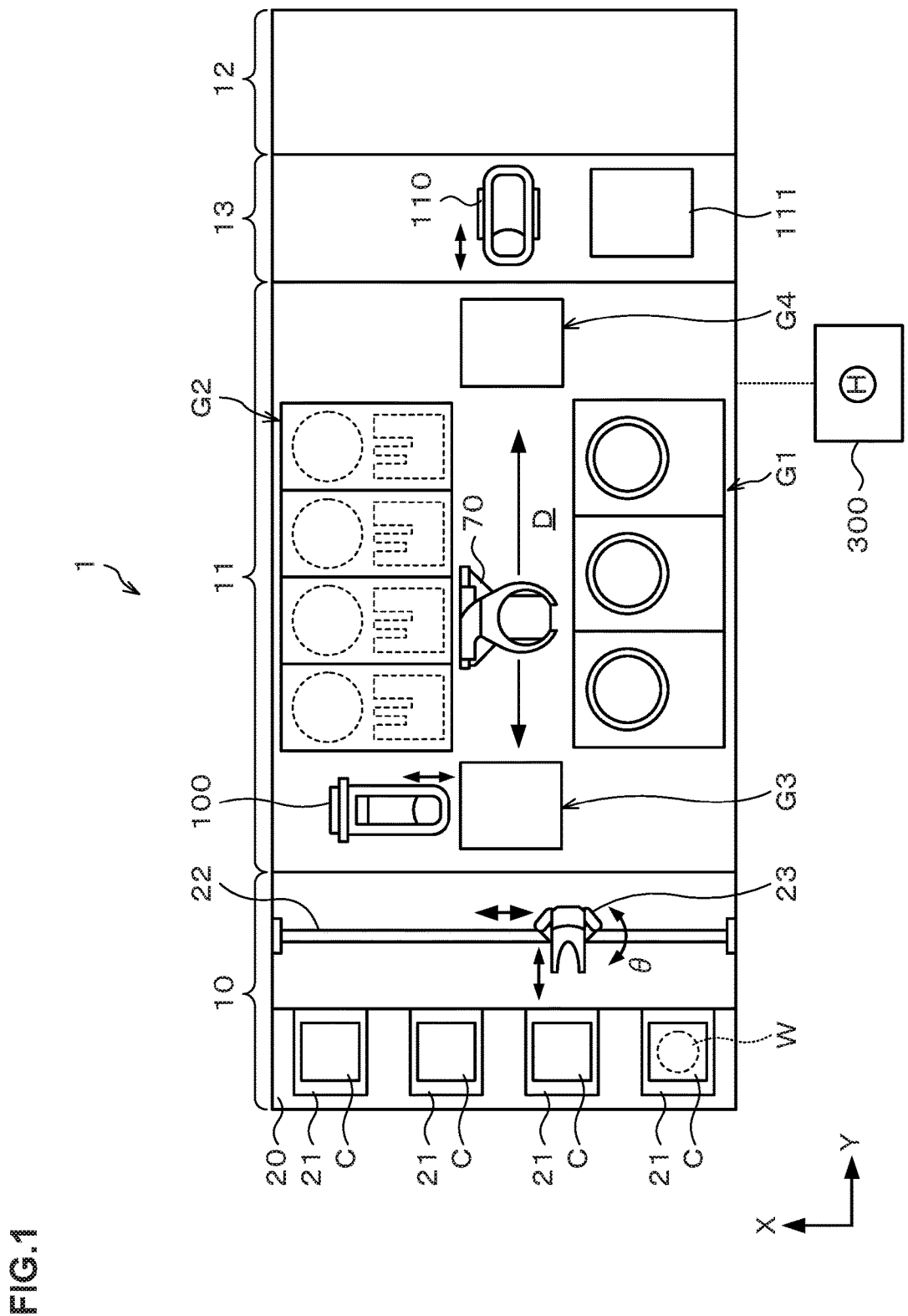
FIG. 1 A plan view illustrating the outline of a configuration of a substrate treatment system according to this embodiment.
Figure 2:
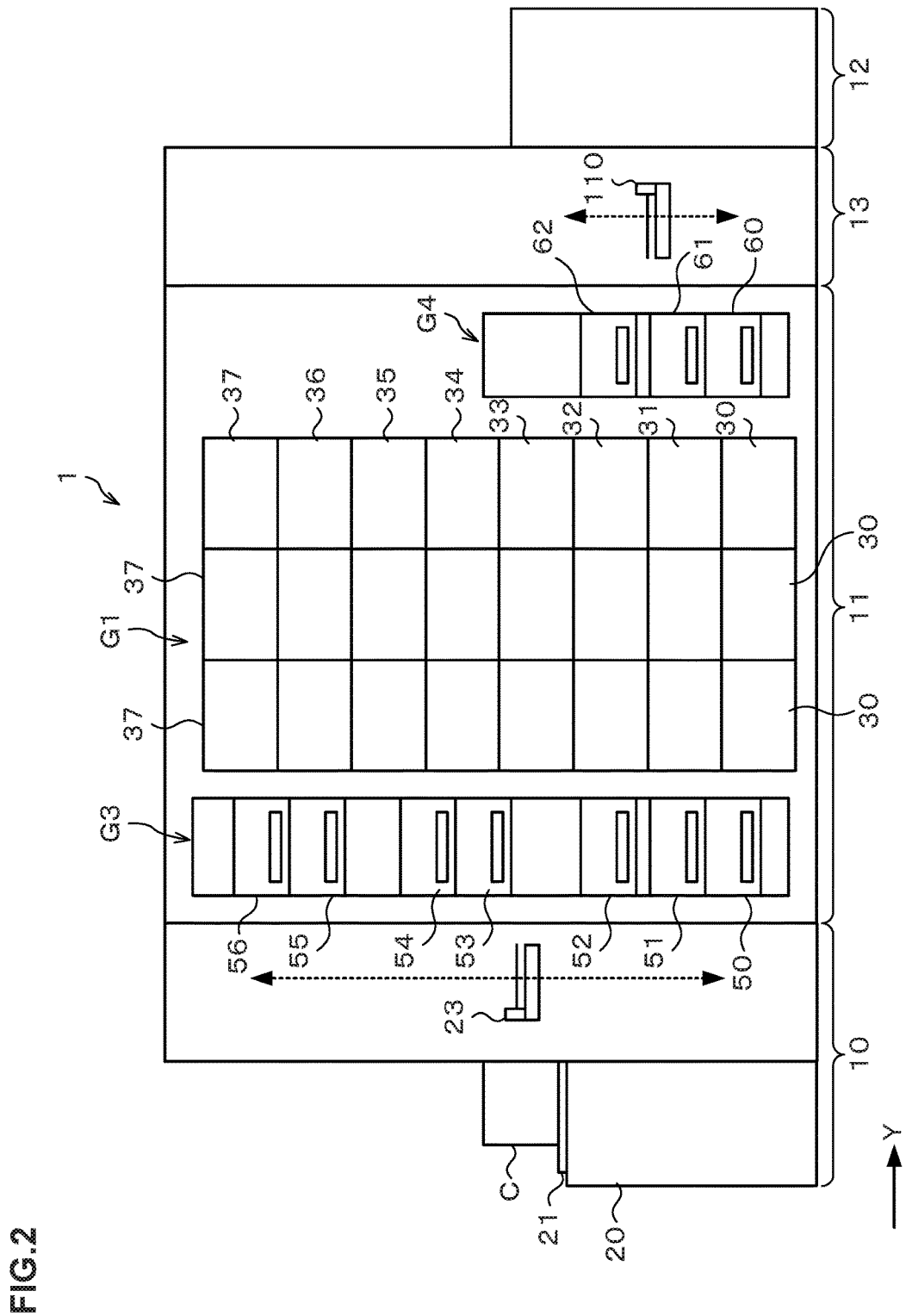
FIG. 2 A front view illustrating the outline of the configuration of the substrate treatment system according to this embodiment.
Figure 3:
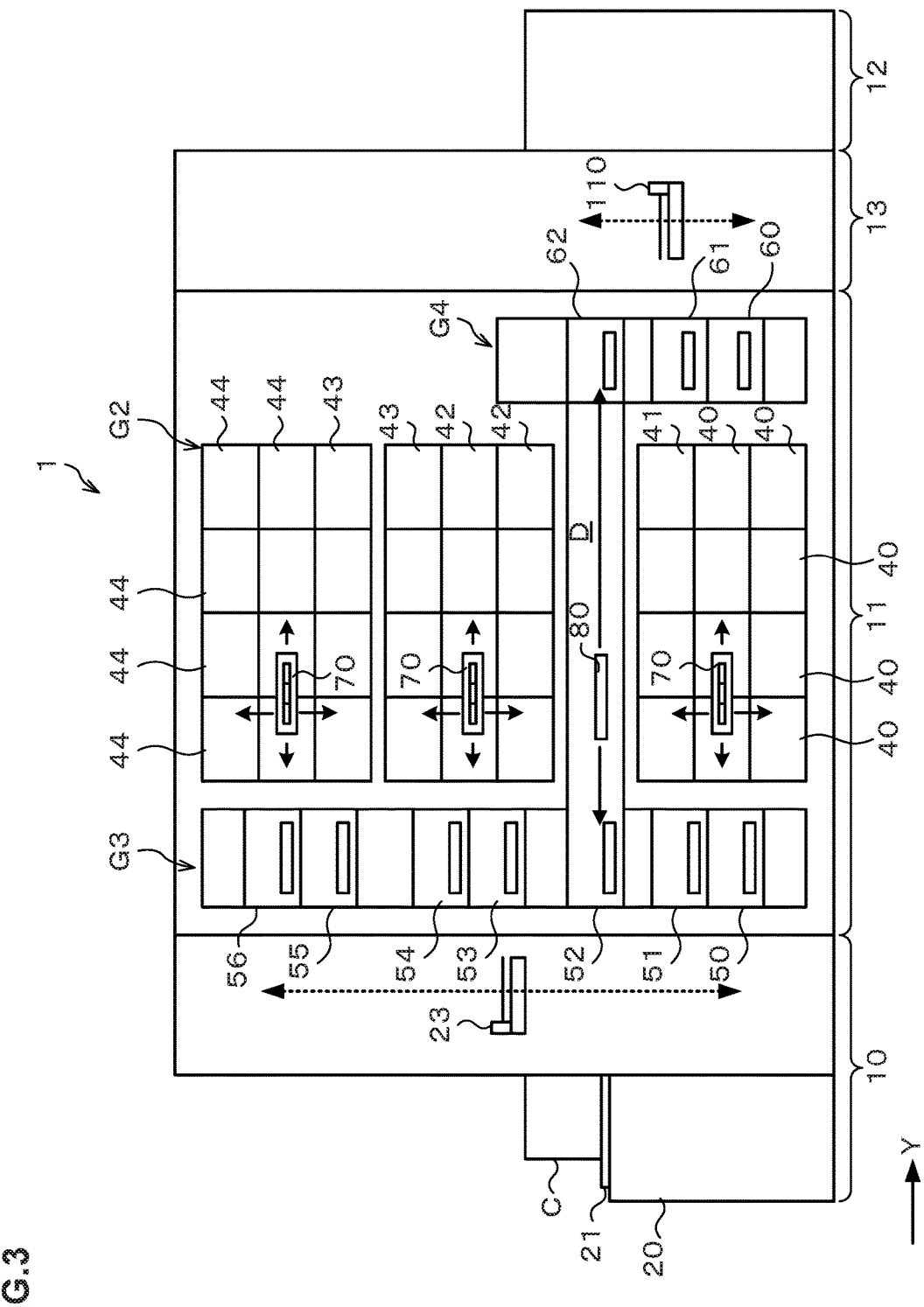
FIG. 3 A rear view illustrating the outline of the configuration of the substrate treatment system according to this embodiment.

Hereinafter, embodiments of the present invention will be described. FIG. 1 is an explanatory view illustrating the outline of a configuration of a substrate treatment system 1 executing a substrate treatment method according to this embodiment. FIG. 2 and FIG. 3 are a front view and a rear view schematically illustrating the outline of an internal configuration of the substrate treatment system 1 respectively. The substrate treatment system 1 in this embodiment is, for example, a coating and developing treatment system, and will be described using the case of forming a predetermined pattern in a film to be treated formed on the upper surface of a wafer W as an example in this embodiment.

The substrate treatment system 1 has, as illustrated in FIG. 1, a configuration in which a cassette station 10 into/out of which a cassette C housing a plurality of wafers W is carried, a treatment station 11 which includes a plurality of various treatment apparatuses performing predetermined treatments on the wafer W, and an interface station 13 which delivers the wafer W to/from an exposure apparatus 12 adjacent to the treatment station 11, are integrally connected.

In the cassette station 10, a cassette mounting table 20 is provided. The cassette mounting table 20 is provided with a plurality of cassette mounting plates 21 on which the cassettes C are mounted when the cassettes C are carried in/out from/to the outside of the substrate treatment system 1.

In the cassette station 10, a wafer carrier apparatus 23 is provided which is movable on a carrier path 22 extending in an X-direction as illustrated in FIG. 1. The wafer carrier apparatus 23 is movable also in a vertical direction and around a vertical axis (in a θ-direction), and can carry the wafer W between the cassette C on each of the cassette mounting plates 21 and a later-described delivery apparatus in a third block G3 in the treatment station 11.

In the treatment station 11, a plurality of, for example, four blocks G1, G2, G3, G4 are provided each including various apparatuses. For example, the first block G1 is provided on the front side (X-direction negative direction side in FIG. 1) in the treatment station 11, and the second block G2 is provided on the rear side (X-direction positive direction side in FIG. 1) in the treatment station 11. Further, the third block G3 is provided on the cassette station 10 side (Y-direction negative direction side in FIG. 1) in the treatment station 11, and the fourth block G4 is provided on the interface station 13 side (Y-direction positive direction side in FIG. 1) in the treatment station 11.

For example, in the first block G1, as illustrated in FIG. 2, a plurality of solution treatment apparatuses, for example, developing apparatuses 30 each of which performs a developing treatment on the wafer W, organic solvent supply apparatuses 31 as polymer removing apparatuses each of which supplies an organic solvent onto the wafer W, anti-reflection film forming apparatuses 32 each of which forms an anti-reflection film on the wafer W, neutral layer forming apparatuses 33 each of which applies a neutralizing agent onto the wafer W to form a neutral layer, resist coating apparatuses 34 each of which applies a resist solution onto the wafer W to form a resist film, coating film forming apparatuses 35 each of which applies a hydrophobic coating solution onto the wafer W to form a hydrophobic coating film, resist removing apparatuses 36 each of which supplies a removing solution for the resist film onto the wafer W to remove the resist film, and block copolymer coating apparatuses 37 each of which applies a block copolymer onto the wafer W, are stacked in order from the bottom.

For example, three pieces of each of the developing apparatus 30, the organic solvent supply apparatus 31, the anti-reflection film forming apparatus 32, the neutral layer forming apparatus 33, the resist coating apparatus 34, the coating film forming apparatus 35, the resist removing apparatus 36, and the block copolymer coating apparatus 37 are arranged side by side in the horizontal direction. Note that the numbers and the arrangement of these solution treatment apparatuses can be arbitrarily selected.

In these solution treatment apparatuses, for example, spin coating of applying a predetermined coating solution onto the wafer W is performed. In the spin coating, the coating solution is discharged, for example, from a coating nozzle onto the wafer W, and the wafer W is rotated to diffuse the coating solution on the front surface of the wafer W.

Note that the block copolymer to be applied onto the wafer W in the block copolymer coating apparatus 37 is a macromolecule (copolymer) having a first polymer (a polymer of first monomers) and a second polymer (a polymer of second monomers) in which the first monomers and the second monomers are linearly polymerized. As the first polymer, a hydrophilic polymer having a hydrophilic property (polarity) is used, and as the second polymer, a hydrophobic polymer having a hydrophobic property (no polarity) is used. In this embodiment, for example, polymethyl methacrylate (PMMA) is used as the hydrophilic polymer and, for example, polystyrene (PS) is used as the hydrophobic polymer. Further, the ratio of a molecular weight of the hydrophilic polymer in the block copolymer is about 20% to 40%, and the ratio of a molecular weight of the hydrophobic polymer in the block copolymer is about 80% to 60%. Besides, the block copolymer is obtained by making the copolymer of the hydrophilic polymer and the hydrophobic polymer into a solution by using a solvent.

Further, the neutral layer formed on the wafer W in the neutral layer forming apparatus 33 has an intermediate affinity to the hydrophilic polymer and the hydrophobic polymer. In this embodiment, for example, a random copolymer or an alternating copolymer of polymethyl methacrylate and polystyrene is used as the neutral agent. Hereinafter, "neutral" means having the intermediate affinity to the hydrophilic polymer and the hydrophobic polymer as described above.

For example, in the second block G2, as illustrated in FIG. 3, thermal treatment apparatuses 40 each of which performs a thermal treatment on the wafer W, ultraviolet irradiation apparatuses 41 each of which irradiates the wafer W with an ultraviolet ray, adhesion apparatuses 42 each of which performs a hydrophobic treatment on the wafer W, edge exposure apparatuses 43 each of which exposes the outer peripheral portion of the wafer W, and polymer separation apparatuses 44 each of which phase-separates the block copolymer applied on the wafer W in the block copolymer coating apparatus 37 into the hydrophilic polymer and the hydrophobic polymer, are arranged side by side in the vertical direction and in the horizontal direction. The thermal treatment apparatus 40 has a hot plate which mounts and heats the wafer W thereon and a cooling plate which mounts and cools the wafer W thereon, and thereby can perform both of a thermal treatment and a cooling treatment. Note that the polymer separation apparatus 44 is also an apparatus that performs a thermal treatment on the wafer W, and its configuration is the same as that of the thermal treatment apparatus 40. The ultraviolet irradiation apparatus 41 has a mounting table on which the wafer W is to be mounted and an ultraviolet irradiation unit which irradiates the wafer W on the mounting table with an ultraviolet ray having a wavelength of, for example, 172 nm. The numbers and the arrangement of the thermal treatment apparatuses 40, the ultraviolet irradiation apparatuses 41, the adhesion apparatuses 42, the edge exposure apparatuses 43, and the polymer separation apparatuses 44 can be arbitrarily selected.

For example, in the third block G3, a plurality of delivery apparatuses 50, 51, 52, 53, 54, 55, 56 are provided in order from the bottom. Further, in the fourth block G4, a plurality of delivery apparatuses 60, 61, 62 are provided in order from the bottom.

A wafer carrier region D is formed in a region surrounded by the first block G1 to the fourth block G4 as illustrated in FIG. 1. In the wafer carrier region D, for example, a plurality of wafer carrier apparatuses 70 are arranged each of which has a carrier arm that is movable, for example, in the Y-direction, the X-direction, the θ-direction, and the vertical direction. The wafer carrier apparatus 70 can move in the wafer carrier region D to carry the wafer W to a predetermined apparatus in the first block G1, the second block G2, the third block G3 and the fourth block G4 therearound.

Further, in the wafer carrier region D, a shuttle carrier apparatus 80 is provided which linearly carries the wafer W between the third block G3 and the fourth block G4.

The shuttle carrier apparatus 80 is configured to be linearly movable, for example, in the Y-direction. The shuttle carrier apparatus 80 can move in the Y-direction while supporting the wafer W, and carry the wafer W between the delivery apparatus 52 in the third block G3 and the delivery apparatus 62 in the fourth block G4.

As illustrated in FIG. 1, a wafer carrier apparatus 100 is provided adjacent on the X-direction positive direction side of the third block G3. The wafer carrier apparatus 100 has a carrier arm that is movable, for example, in the X-direction, the θ-direction, and the vertical direction. The wafer carrier apparatus 100 can move up and down while supporting the wafer W to carry the wafer W to each of the delivery apparatuses in the third block G3.

In the interface station 13, a wafer carrier apparatus 110 and a delivery apparatus 111 are provided. The wafer carrier apparatus 110 has a carrier arm that is movable, for example, in the Y-direction, the θ-direction, and the vertical direction. The wafer carrier apparatus 110 can carry the wafer W among each of the delivery apparatuses in the fourth block G4, the delivery apparatus 111, and the exposure apparatus 12, for example, while supporting the wafer W by the carrier arm.

In the above substrate treatment system 1, a control unit 300 is provided as illustrated in FIG. 1. The control unit 300 is, for example, a computer and has a program storage unit (not illustrated). In the program storage unit, a program that controls the treatments on the wafer W in the substrate treatment system 1 is stored. Further, the program storage unit also stores a program that controls the operations of the above-described various treatment apparatuses and a driving system such as the carrier apparatuses to realize a wafer treatment in the substrate treatment system 1. Note that the programs may be the ones which are recorded, for example, in a computer-readable storage medium H such as a computer-readable hard disk (HD), flexible disk (FD), compact disk (CD), magneto-optical disk (MO), or memory card and installed from the storage medium into the control unit 300.

Figure 4:
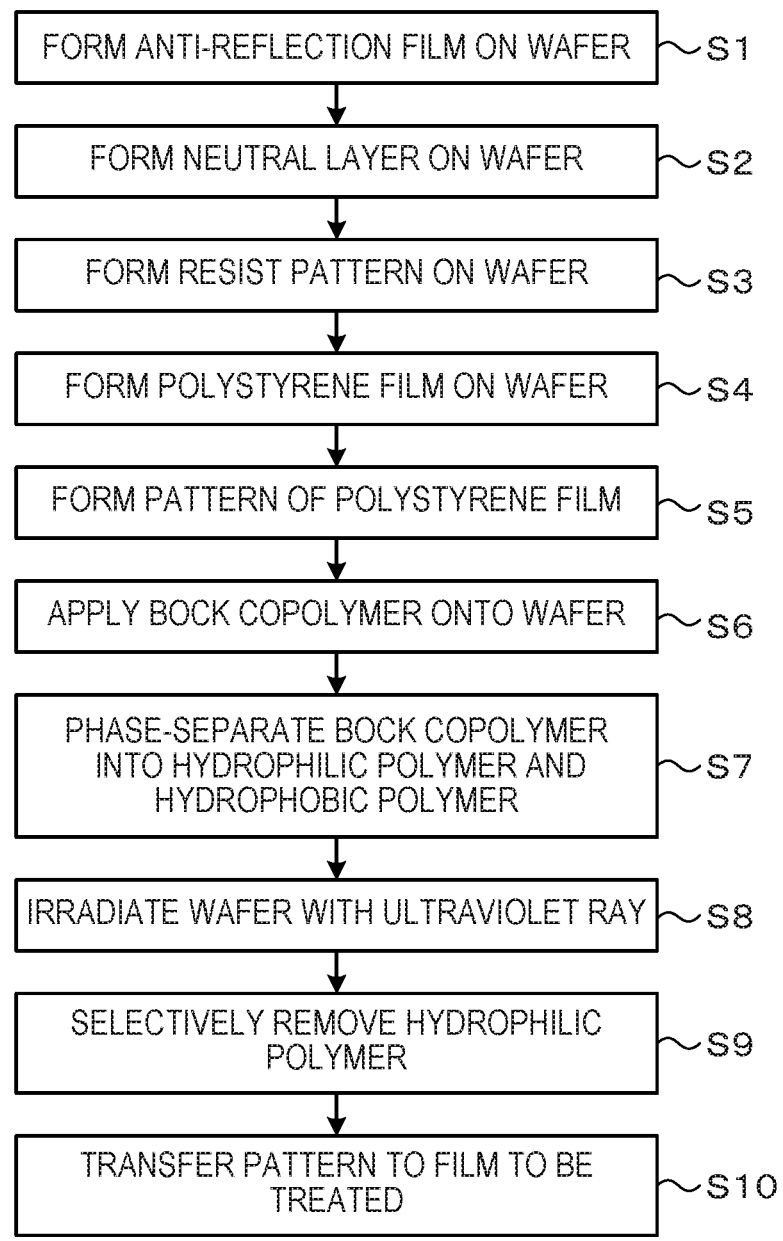
FIG. 4 A flowchart explaining main steps of a wafer treatment.

Next, the wafer treatment performed using the substrate treatment system 1 configured as described above will be described. FIG. 4 is a flowchart illustrating examples of main steps of the wafer treatment.

First, the cassette C housing a plurality of wafers W is carried into the cassette station 10 of the substrate treatment system 1 and the wafers W in the cassette C are sequentially carried by the wafer carrier apparatus 23 to the delivery apparatus 53 in the treatment station 11.

Figure 5:
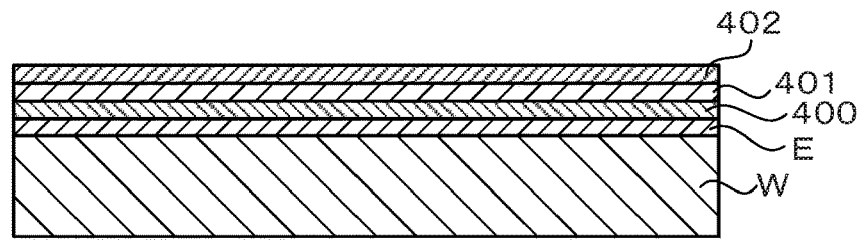
FIG. 5 An explanatory view of a longitudinal cross-section illustrating an appearance in which an anti-reflection film, a neutral layer, and a resist film are formed on a wafer.

The wafer W is then carried to the thermal treatment apparatus 40 and temperature-regulated, and then carried to the anti-reflection film forming apparatus 32 in which an anti-reflection film 400 is formed on the wafer W as illustrated in FIG. 5 (Step S1 in FIG. 4). Note that on the wafer W in this embodiment, a film to be treated E has been formed on the upper surface of the wafer W as already described, and the anti-reflection film 400 is formed on the upper surface of the film to be treated E. The wafer W is then carried to the thermal treatment apparatus 40, and heated and temperature-regulated.

The wafer W is then carried to the neutral layer forming apparatus 33, in which the neutralizing agent is applied onto the anti-reflection film 400 on the wafer W to form a neutral layer 401 as illustrated in FIG. 5 (neutral layer forming step, Step S2 in FIG. 4). Thereafter, the wafer W is carried to the thermal treatment apparatus 40 and heated and temperature-regulated.

Then, the wafer W is carried to the adhesion unit 42 and subjected to an adhesion treatment. The wafer W is then carried to the resist coating apparatus 34, in which the resist solution is applied onto the neutral layer 401 of the wafer W to form a resist film 402 as illustrated in FIG. 5. Thereafter, the wafer W is carried to the thermal treatment apparatus 40 and subjected to a pre-bake treatment. The wafer W is then carried to the edge exposure apparatus 43 and subjected to edge exposure processing.

Figure 6:
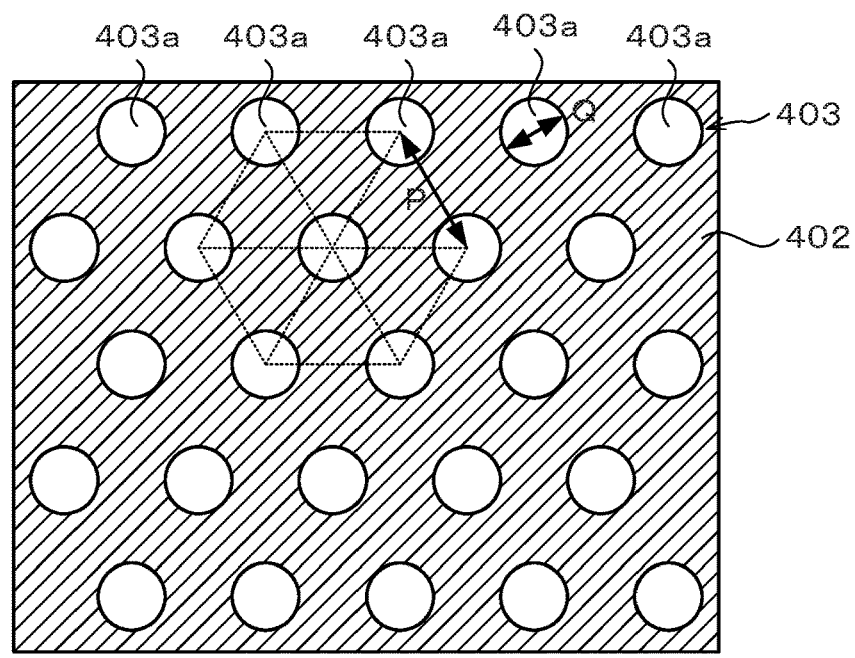
FIG. 6 An explanatory view of a planar view illustrating an appearance in which a resist pattern is formed on the neutral layer.
Figure 7:
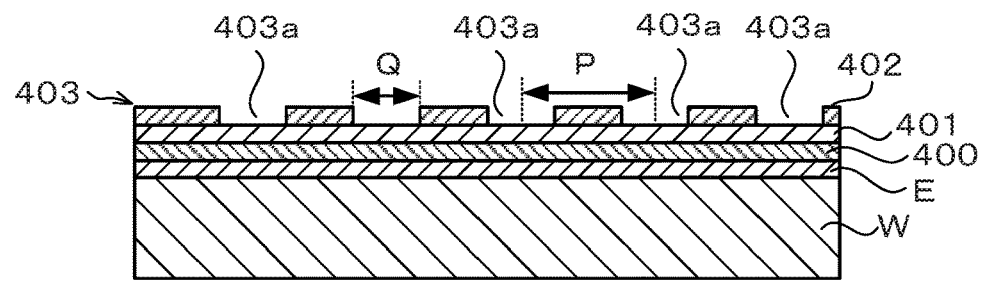
FIG. 7 An explanatory view of a longitudinal cross-section illustrating the appearance in which the resist pattern is formed on the neutral layer.

Thereafter, the wafer W is carried by the wafer carrier apparatus 110 in the interface station 13 to the exposure apparatus 12 and subjected to exposure processing. The wafer W is then carried to the thermal treatment apparatus 40 and subjected to a post-exposure bake treatment. The wafer W is thereafter carried to the developing apparatus 30 and subjected to a developing treatment. After the development ends, the wafer W is carried to the thermal treatment apparatus 40 and subjected to a post-bake treatment. Thus, a predetermined resist pattern 403 of the resist film 402 is formed on the neutral layer 401 of the wafer W as illustrated in FIG. 6, FIG. 7 (Step S3 in FIG. 4). The resist pattern 403 in this embodiment is a pattern in which circular hole portions 403a each having a diameter Q are arranged at positions corresponding to a hexagonal close-packed structure in a plan view. More specifically, the distances (pitches P in FIG. 6) between centers of the hole portions 403a are the same, and three adjacent hole portions 403a are arranged in an equilateral triangle shape. The pitch P in this embodiment is, for example, about 80 nm. Note that the diameter Q of the hole portion 403a is set to be approximately 0.4 times to 0.75 times the pitch P, approximately 60 nm that is approximately 0.75 times the pitch P in this embodiment. The basis of setting the diameter Q of the hole portion 403a will be described later.

Figure 8:
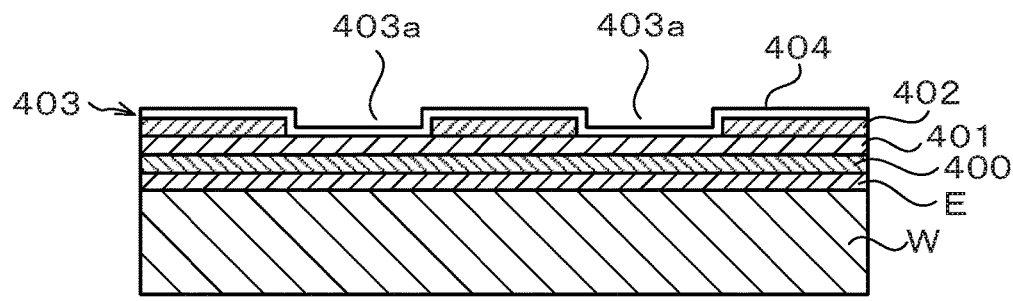
FIG. 8 An explanatory view of a longitudinal cross-section illustrating an appearance in which a polystyrene film is formed on the resist pattern.

The wafer W is then carried to the coating film forming apparatus 35. In the coating film forming apparatus 35, a coating solution is supplied onto the wafer W on which the resist pattern 403 is formed. As the coating solution, a coating solution having a hydrophobic property, in other words, having a lower energy difference with respect to the hydrophobic polymer of the hydrophilic polymer and the hydrophobic polymer in the block copolymer is used. Note that in this embodiment, the coating solution applied in the coating film forming apparatus 35 is the one obtained, for example, by making polystyrene into a solution form by using a solvent. Thus, as illustrated in FIG. 8, a polystyrene film 404 is formed as the hydrophobic coating film on the resist pattern 403 (Step S4 in FIG. 4). Note that two hole portions 403a of the five hole portions 403a illustrated in FIG. 7 are enlarged and illustrated in FIG. 8.

Figure 9:
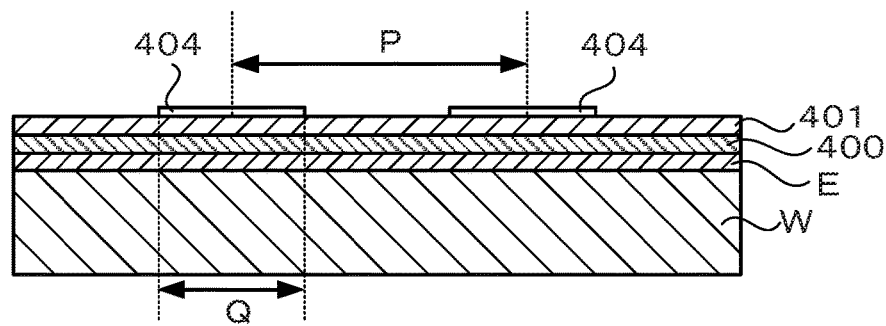
FIG. 9 An explanatory view of a longitudinal cross-section illustrating an appearance in which patterns of the polystyrene films are formed on the neutral layer.

The wafer W is then carried to the resist removing apparatus 36. In resist removing apparatus 36, the removing solution for the resist is supplied onto the wafer W, whereby the resist pattern 403 of the resist film 402 is removed. As the removing solution for the resist, for example, a mixed solution of organic amine and a polar solvent is used. When the resist pattern 403 is removed, the polystyrene films 404 formed in the hole portions 403a of the resist pattern 403 remain on the neutral layer 401. As a result, as illustrated in FIG. 9, circular patterns having the same diameter Q and pitch P as those of the hole portions 403a of the resist pattern 403 are formed of the polystyrene films 404 on the neutral layer 401 (coating film pattern forming step, Step S5 in FIG. 4). Accordingly, the circular patterns of the polystyrene films 404 align in a triangle shape with the uniform pitch P among adjacent polystyrene films 404 similarly to the hole portions 403a of the resist pattern 403.

Figure 10:
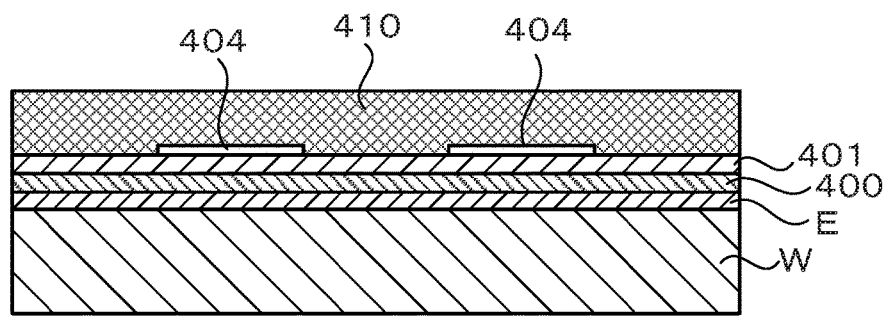
FIG. 10 An explanatory view of a longitudinal cross-section illustrating an appearance in which a block copolymer is applied on the wafer.

The wafer W is then carried to the block copolymer coating apparatus 37. In the block copolymer coating apparatus 37, a block copolymer 410 is applied onto the wafer W as illustrated in FIG. 10 (block copolymer coating step, Step S6 in FIG. 4).

Figure 11:
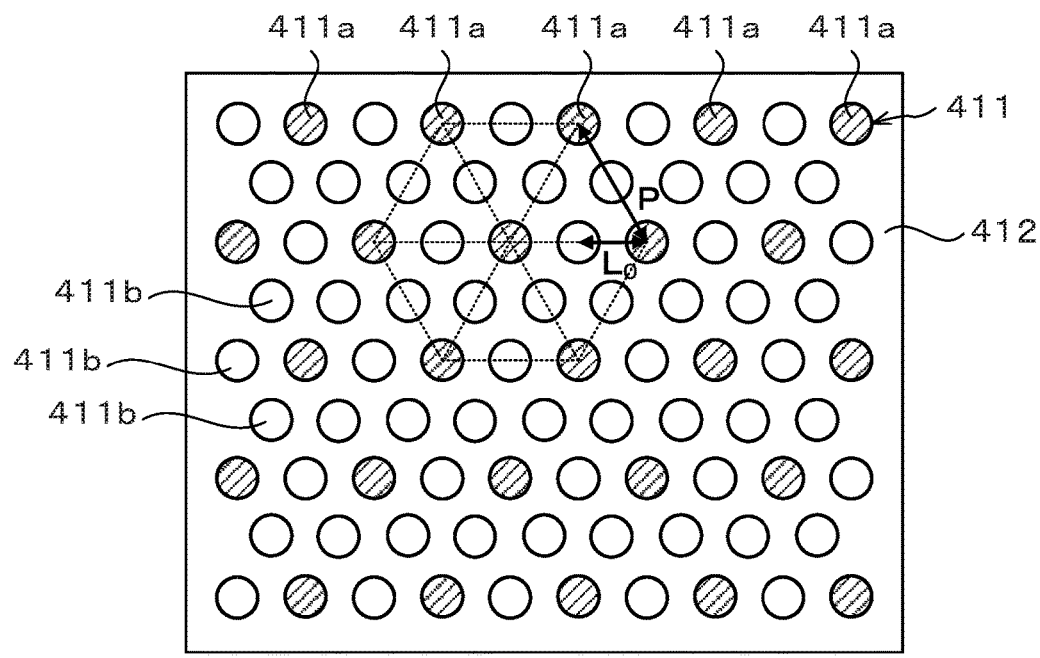
FIG. 11 An explanatory view of a plane illustrating an appearance in which the block copolymer is phase-separated into a hydrophilic polymer and a hydrophobic polymer.
Figure 12:
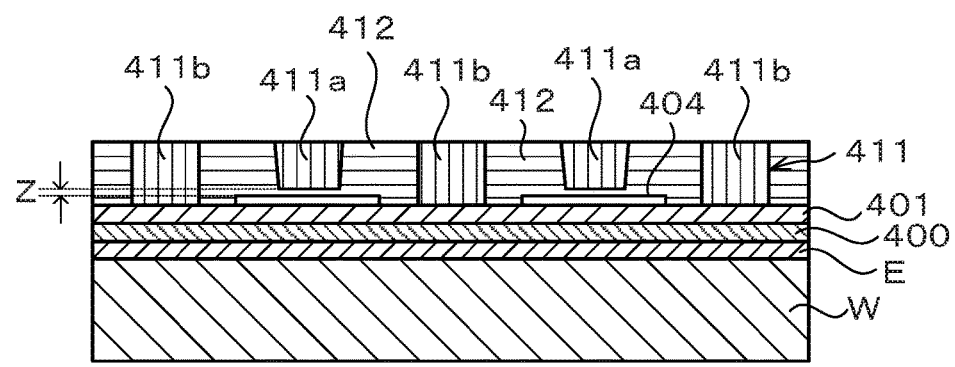
FIG. 12 An explanatory view of a longitudinal cross-section illustrating an appearance in which the block copolymer is phase-separated into the hydrophilic polymer and the hydrophobic polymer.

The wafer W is then carried to the polymer separation apparatus 44 and subjected to a thermal treatment at a predetermined temperature. This phase-separates the block copolymer 410 on the wafer W into a hydrophilic polymer and a hydrophobic polymer (polymer separating step, Step S7 in FIG. 4). Here, as described above, the ratio of a molecular weight of the hydrophilic polymer is 20% to 40% and the ratio of a molecular weight of the hydrophobic polymer is 80% to 60% in the block copolymer 410. Then, as illustrated in FIG. 11, the block copolymer 410 is phase-separated such that columnar hydrophilic polymers 411 align at regular intervals and a hydrophobic polymer 412 surrounds the hydrophilic polymers 411. In this event, since the polystyrene films 404 are formed on the neutral layer 401, the hydrophobic polymer 412 after phase-separation is drawn to above the polystyrene films 404 having a lower energy difference than that of the neutral layer 401 as illustrated in FIG. 12 and aligns to be in contact with the polystyrene films 404. On the other hand, the hydrophilic polymer 411 exists at a ratio of 20% to 40% in the block copolymer 410, and the hydrophilic polymer 411 therefore aligns at a position more stable in energy. As a result, as illustrated in FIG. 12, the hydrophilic polymers 411 align at positions corresponding to the centers of the circular polystyrene films 404. In this event, since the hydrophilic polymer 411 is large in energy difference with respect to the polystyrene film 404, a gap Z is formed between the hydrophilic polymer 411 and the polystyrene film 404 in some cases. Note that in FIG. 11, FIG. 12, numerals of the hydrophilic polymers aligning at the positions corresponding to the centers of the circular polystyrene films 404 are "411$a$", and numerals of the other hydrophilic polymers are "411$b$" for convenience. Further, the hydrophilic polymer of the numeral "411$a$" is called a first hydrophilic polymer, and the hydrophilic polymer of the numeral "411$b$" is called a second hydrophilic polymer in the following.

Further, the second hydrophilic polymers 411$b$ align also in a region other than the circular polystyrene films 404, in which case they align at positions stable in energy, and as a result, they align each at an intermediate position between adjacent circular polystyrene films 404 as illustrated in FIG. 11, FIG. 12. In other words, the second hydrophilic polymer 411$b$ aligns at a position between the first hydrophilic polymers 411$a$ on the circular polystyrene films 404. In this event, a pitch $L_0$ between adjacent first hydrophilic polymer 411$a$ and second hydrophilic polymer 411$b$ is half the pitch P between the polystyrene films 404. As a result, patterns of the first hydrophilic polymers 411$a$ and the second hydrophilic polymers 411$b$ align at the pitch $L_0$ being half the pitch P between the patterns of the polystyrene films 404 at positions corresponding to the hexagonal close-packed structure in a plan view.

Note that the pitch $L_0$ and the diameter of the first hydrophilic polymer 411$a$ and the second hydrophilic polymer 411$b$ are decided by a $\chi$ parameter being an interaction parameter between the hydrophilic polymer 411 and the hydrophobic polymer 412 constituting the block copolymer 410 and molecular weights of the polymers. Accordingly, the pitch P between the patterns of the polystyrene films 404, namely, the pitch P between the hole portions 403$a$ of the resist pattern 403 is decided based on the pitch $L_0$ obtained by a test performed in advance. In other words, the ratio between the hydrophilic polymer 411 and the hydrophobic polymer 412 in the block copolymer 410 is decided so as to obtain a desired pitch $L_0$, and then the pitch P is decided based on the desired pitch $L_0$.

Next, setting of the diameter Q of the hole portion 403$a$ of the resist pattern 403, namely, the diameter Q of the circular pattern of the polystyrene film 404 will be described. As has been already described, when the block copolymer 410 is phase-separated, the hydrophobic polymer 412 having a low energy difference aligns on the upper surfaces of the polystyrene films 404, and the hydrophilic polymers 411 having a large energy difference align at positions not in contact, as much as possible, with the polystyrene films 404. Therefore, the diameter Q, if set to be too large, mainly influences the arrangement of the second hydrophilic polymers 411$b$. The influence on the arrangement of the second hydrophilic polymers 411$b$ will be concretely described using FIG. 13.

Figure 13:
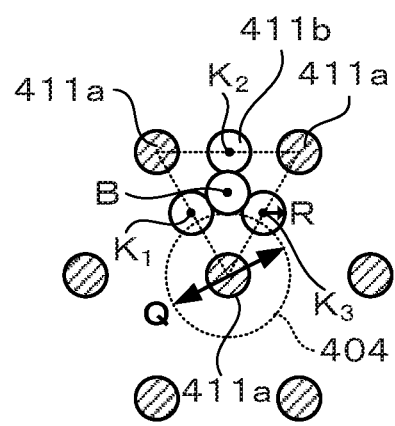
FIG. 13 An explanatory view of a plane illustrating the relation between the diameter of the pattern of the polystyrene film and the arrangement of the hydrophilic polymers.

As has been described, the second hydrophilic polymers 411$b$ align each at an intermediate position between the first hydrophilic polymers 411$a$ located on the centers of the polystyrene films 404. In this case, examples of the position where the distances to adjacent first hydrophilic polymers 411$a$ are equal include, when its range is limited to three first hydrophilic polymers 411$a$, a barycenter B of the three first hydrophilic polymers 411$a$ in addition to center points $K_1$, $K_2$, $K_3$ of straight lines linking the first hydrophilic polymers 411$a$ as illustrated in FIG. 13. Normally, the second hydrophilic polymers 411$b$ align at the positions of the center points $K_1$, $K_2$, $K_3$ stable in energy. However, as illustrated with a broken circle in FIG. 13, for example, if the diameter Q of the pattern of the polystyrene film 404 is set such that the circle overlaps with the second hydrophilic polymers 411$b$ located at the center points $K_1$, $K_3$ in a plan view, the center points $K_1$, $K_3$ are no longer the positions stable in energy for the second hydrophilic polymers 411$b$. Then, the second hydrophilic polymers 411$b$ align not at the center points $K_1$, $K_3$ but at the position of the barycenter B so as to decrease the energy difference. As a result, the hydrophilic polymers 411 rotate by 30 degrees in an arbitrary direction, for example, as compared with the case illustrated in FIG. 11 where the second hydrophilic polymers 411$b$ align at the center points $K_1$, $K_2$, $K_3$, and align at positions where the pitch $L_0$ between the hydrophilic polymers 411 becomes 2 $\sqrt{3}/3$ times.

Accordingly, when the radius of the second hydrophilic polymer 411$b$ is R, setting the diameter Q of the pattern of the polystyrene film 404 to 2($L_0$–R) or less makes it possible to align the second hydrophilic polymers 411$b$ at the center points $K_1$, $K_2$, $K_3$ and set the pitch between the hydrophilic polymers 411 after alignment to $L_0$. On the other hand, when it is desired to set the pitch between the hydrophilic polymers 411 after alignment to $2\sqrt{3}/3$ times $L_0$, it is only necessary to set the diameter Q of the pattern of the polystyrene film 404 to more than 2($L_0$–R) and 2($L_1$–R) or less where the pitch of $2\sqrt{3}/3$ times $L_0$ is $L_1$. More specifically, it is possible to change the pitch between the pitch $L_0$ and the pitch $L_1$ by the set value of the diameter Q while aligning the hydrophilic polymers 411 at positions corresponding to the hexagonal close-packed structure.

Note that when the desired pitch between the hydrophilic polymers 411 is $L_0$, the diameter Q of the pattern of the polystyrene film 404 is preferably set to 2($L_0$–R) or less as above described. As a result of the earnest study of the present inventors, it has been confirmed that when the ratio of the molecular weight of the hydrophilic polymer 411 in the block copolymer 410 is about 20% to 40%, it is more preferable to set the diameter Q of the pattern of the polystyrene film 404 to equal to or less than 1.5 times the desired pitch $L_0$ and to equal to or less than 0.75 times the pitch P when using the pitch P between the patterns of the polystyrene films 404 as a reference, in order to stably align the hydrophilic polymers 411 at the pitch $L_0$. Accordingly, the diameter Q in this embodiment is set to 60 nm that is 0.75 times the pitch P.

Note that it is unnecessary to set the lower limit value for the diameter Q of the pattern of the polystyrene film 404, in particular, from the viewpoint of aligning the hydrophilic polymers 411 at the desired pitch $L_0$. However, it has been confirmed by the present inventors that as the diameter Q of the circular pattern of the polystyrene film 404 is made smaller, the value of the gap Z illustrated in FIG. 12 formed between the first hydrophilic polymer 411$a$ and the polystyrene film 404 becomes larger. Therefore, the gap Z is preferably small as much as possible from the viewpoint of using the hydrophobic polymer 412 as a mask of etching. It has also been confirmed by the present inventors that to set the gap Z to a desired value or less, it is preferable to set the diameter Q to equal to or more than approximately 0.8 times the desired pitch $L_0$ and to equal to or more than 0.4 times the pitch P when using the pitch P between the patterns of the polystyrene films 404 as a reference. From the result, it can be said that in the case of forming the etching mask for forming the hole patterns, by the hydrophobic polymer 412, it is preferable to set the diameter Q to approximately 0.8 times to 1.5 times the desired pitch $L_0$ between the columnar patterns by the hydrophilic polymers 411, or 0.4 times to 0.75 times the pitch P. Accordingly, when the desired pitch $L_0$ is 40 nm as in this embodiment, the diameter Q only needs to be approximately 32 nm to 60 nm, and has a process margin of approximately 30 nm.

Figure 14:
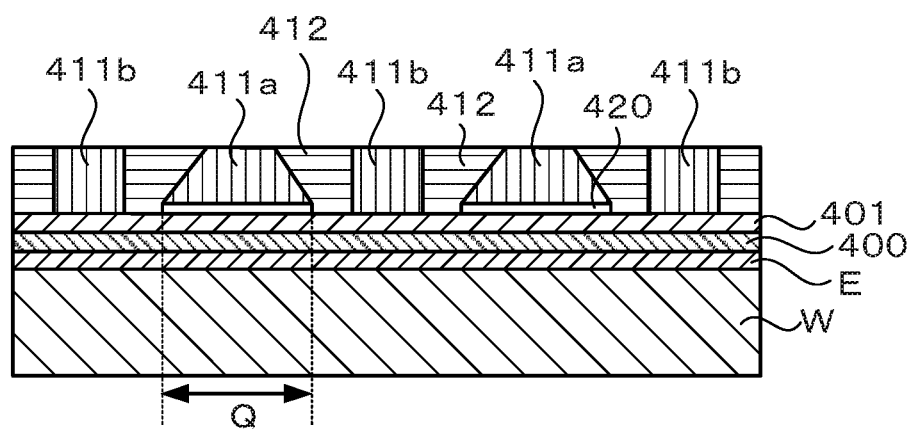
FIG. 14 An explanatory view of a longitudinal cross-section illustrating an appearance in which columnar hydrophilic polymers align by a conventional method.

On the other hand, as disclosed in Patent Document 1, in the case of using the circular patterns by the hydrophilic coating film as guides for aligning the hydrophilic polymers 411, the process margin to the diameter Q of the pattern is extremely small as has been described. More specifically, as illustrated in FIG. 14, when the guide is formed of a hydrophilic coating film 420, the first hydrophilic polymer 411a after phase separation aligns to be in contact with the coating film 420 having a small energy difference, so that when the diameter Q is larger than the desired diameter of the hydrophilic polymer 411, the hydrophilic polymer 411 becomes a truncated conical shape expanding downward in diameter. When the diameter Q is too large, the first hydrophilic polymer 411a becomes an almost truncated conical shape in which the first hydrophilic polymer 411a is not exposed to the upper surface of the hydrophobic polymer 412. In this case, in the etching using the hydrophobic polymer 412 as a mask, the film to be treated E cannot be processed in a desired dimension. Accordingly, the diameter Q needs to be almost the same or smaller than the diameter of the columnar hydrophilic polymer 411 after phase separation. However, generally, there is an unavoidable error of about 5 nm in the dimension (CD: Critical Dimension) of the resist pattern 403. The error is too large to ignore with respect to the diameter of the hydrophilic polymer 411 because the diameter of the hydrophilic polymer 411 is approximately 20 nm to 30 nm. Therefore, at the time when forming the coating film 420, there is little or no process margin with respect to the diameter Q, and it is very difficult to control the diameter Q of the coating film 420 in accordance with the diameter of the hydrophilic polymer 411. The difference in process margin is the reason why the polystyrene film 404 is used as the guide for aligning the first hydrophilic polymer 411a in this embodiment.

After the block copolymer 410 is phase-separated in the polymer separation apparatus 44, the wafer W is carried to the ultraviolet irradiation apparatus 41. In the ultraviolet irradiation apparatus 41, irradiation of the wafer W with the ultraviolet ray cuts the bonding chain of polymethyl methacrylate being the hydrophilic polymer 411 and causes a cross-linking reaction of polystyrene being the hydrophobic polymer 412 (Step S8 in FIG. 4).

Figure 15:
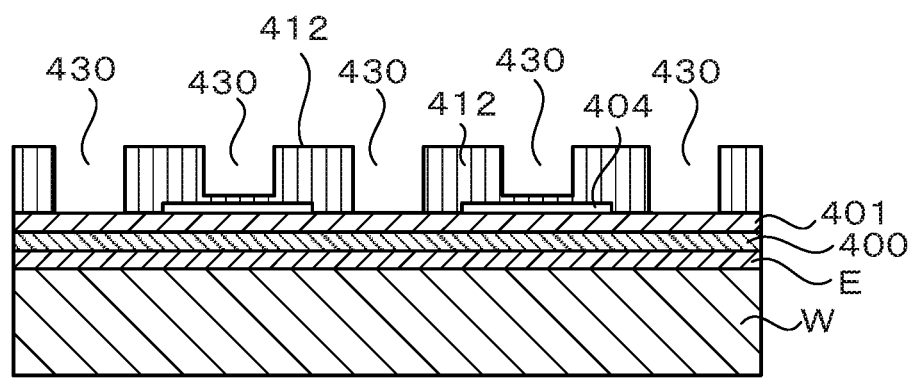
FIG. 15 An explanatory view of a longitudinal cross-section illustrating an appearance in which the hydrophilic polymer is selectively removed from the block copolymer after phase separation.

The wafer W is then carried to the organic solvent supply apparatus 31. In the organic solvent supply apparatus 31, an organic solvent having a polarity (polar organic solvent) is supplied to the wafer W. As the polar organic solvent, for example, IPA (isopropyl alcohol) or the like is used. Thus, the hydrophilic polymer 411 whose bonding chain has been cut by the irradiation with the ultraviolet ray is dissolved with the organic solvent, and the hydrophilic polymer 411 is selectively removed from the wafer W (polymer removing step, Step S9 in FIG. 4). As a result, hole patterns 430 are formed of the hydrophobic polymer 412 as illustrated in FIG. 15.

Thereafter, the wafer W is carried by the wafer carrier apparatus 70 to the delivery apparatus 50, and then carried by the wafer carrier apparatus 23 in the cassette station 10 to the cassette C on the predetermined cassette mounting plate 21.

Figure 16:
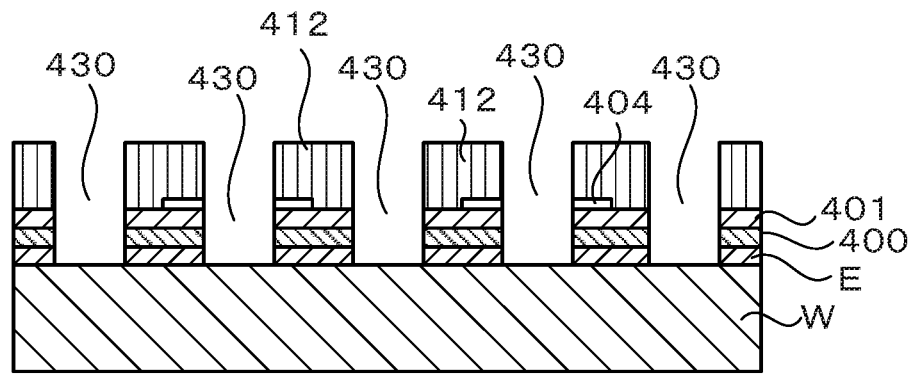
FIG. 16 An explanatory view of a longitudinal cross-section illustrating an appearance in which a film to be treated is subjected to an etching treatment.

Thereafter, the cassette C is carried to an etching treatment apparatus (not illustrated) provided outside the substrate treatment system 1, and the neutral layer 401, the anti-reflection film 400, and the film to be treated E are subjected to an etching treatment using the hydrophobic polymer 412 as a mask. Thus, hole patterns 430 are transferred to the film to be treated E as illustrated in FIG. 16 (Step S10 in FIG. 4). Note that at the time of etching, the hydrophobic polymer 412 and the polystyrene film 404 remain in the hole pattern 430 formed of the first hydrophilic polymer 411a, but it is possible to perform processing with no difference from the hole pattern 430 corresponding to the second hydrophilic polymer 411b by appropriately adjusting the gap Z and the thickness of the polystyrene film 404. As the etching treatment apparatus, for example, an RIE (Reactive Ion Etching) apparatus is used. More specifically, in the etching treatment apparatus, dry etching is performed which etches films to be treated such as the hydrophilic polymer and the anti-reflection film using reactive gas (etching gas), ions, or radicals.

Thereafter, the wafer W is subjected again to an etching treatment, whereby the hydrophobic polymer 412, the neutral layer 401, and the anti-reflection film 400 on the wafer W are removed. The wafer W is then carried out of the etching treatment apparatus, with which a series of wafer treatment ends.

According to the above embodiment, the circular patterns of the polystyrene films 404 being hydrophilic films are formed on the wafer W, and then the block copolymer 410 is applied and then phase-separated, so that the columnar first hydrophilic polymers 411a autonomously align at positions corresponding to the centers of the circular patterns of the polystyrene films 404. In this event, by setting the diameter Q of the pattern of the polystyrene film 404 to $2(L_0-R)$ or less, the second hydrophilic polymer 411b aligns at the intermediate position between the first hydrophilic polymers 411a. As a result, the hydrophilic polymers 411 align at positions corresponding to the hexagonal close-packed structure in a plan view at the pitch $L_0$ that is half the pitch P between the polystyrene films 404 formed on the wafer W. Accordingly, it is possible to appropriately form a predetermined pattern on the wafer W while ensuring an extremely large process margin in the dimension of the diameter Q as compared with the case of using a hydrophilic film for controlling the arrangement of the columnar hydrophilic polymers 411.

Further, according to this method, the diameter Q of the circular pattern of the polystyrene film 404 may be set to 0.8 to 1.5 times the desired pitch $L_0$ between the hydrophilic polymers 411 after phase separation of the block copolymer 410.

Besides, in the case of using the polystyrene films 404 as guides for the first hydrophilic polymers 411a, setting the diameter Q of the pattern of the polystyrene film 404 can limit the arrangement of the second hydrophilic polymers 411b each aligning between the first hydrophilic polymers 411a, so that at the time when phase-separating the block copolymer 410 at Step S7, the alignment of the second hydrophilic polymers 411b is quickly decided. More specifically, in the case of aligning the hydrophilic polymers 411 using the hydrophilic coating films 420 as the guides as in Patent Document 1, the first hydrophilic polymers 411a align first on the coating films 420, and then the second hydrophilic polymers 411b align in a manner to fill up a space between the first hydrophilic polymers 411a. This is because when the films formed on the wafer W surface in contact with the block copolymer 410 are the hydrophilic coating film 420 and the neutral layer 401, the second hydrophilic polymers 411b can align at any positions of the neutral layer 401 from the viewpoint of energy. Accordingly, to decide the alignment of the second hydrophilic polymers 411b, the columnar first hydrophilic polymers 411a need to be formed first on the coating films 420. Therefore, the time required for a thermal treatment for phase separation becomes longer, resulting in a decrease in throughput of the wafer treatment.

In contrast to the above, in this embodiment, the second hydrophilic polymer 411b having a large energy difference does not align, for example, inside the circular pattern of the polystyrene film 404 having the diameter Q illustrated in FIG. 13. In other words, the second hydrophilic polymer 411b autonomously aligns at any one of the center points $K_1$, $K_2$, $K_3$ and the barycenter B. Further, as described above, appropriately setting the diameter Q makes it possible to guide the arrangement of the second hydrophilic polymers 411b to the center points $K_1$, $K_2$, $K_3$. As a result, the alignment of the second hydrophilic polymers 411b is quickly decided, thus reducing the time required for the thermal treatment for phase separation, with the result that the throughput of the wafer treatment can be improved.

Note that the ratio of the molecular weight of the hydrophilic polymer is about 20% to 40% in the above embodiment, but it has been confirmed by the present inventors that it is more preferable to set the ratio of the molecular weight of the hydrophilic polymer 411 in the block copolymer 410 to 32% to 34% and set the ratio of the molecular weight of the hydrophobic polymer 412 to 68% to 66% from the viewpoint of setting the value of the gap Z formed between the first hydrophilic polymer 411a and the polystyrene film 404 to the desired value. Explaining in concrete terms, in the case of using the circular patterns of the polystyrene films 404 as guides, when the block copolymer 410 is subjected to the thermal treatment for phase separation, the hydrophilic polymers 411 move first to the positions above the center portions of the polystyrene films 404 that are the positions not in contact with the polystyrene films 404 and stable in energy. This comes into a state as if islands of the first hydrophilic polymers 411a float in the sea of the hydrophobic polymer 412 as illustrated in FIG. 12. On the other hand, when the second hydrophilic polymers 411b align at the center points $K_1$, $K_2$, $K_3$, the first hydrophilic polymer 411a above the center portion of the polystyrene film 404 changes into an almost columnar shape as a whole because the diameter of the upper surface of the first hydrophilic polymer 411a reduces so as to make the distances to the adjacent second hydrophilic polymers 411b constant (to stable in energy). Then, even if the diameter of the upper surface of the first hydrophilic polymer 411a reduces, the volume of the island of the first hydrophilic polymer 411a does not change, and therefore the volume corresponding to the reduced diameter of the upper surface moves downward in the thickness direction of the wafer W. In short, according to the degree of the movement downward in the thickness direction of the wafer W of the first hydrophilic polymer 411a, the value of the gap Z is decided. The volume of the island of the first hydrophilic polymer 411a is one of factors deciding how much the first hydrophilic polymer 411a moves downward in the thickness direction of the wafer W, and the volume of the island of the first hydrophilic polymer 411a depends on the ratio of the molecular weight of the hydrophilic polymer in the block copolymer 410. Accordingly, the ratio of the molecular weight of the hydrophilic polymer in the block copolymer 410 can be adjusted to adjust the value of the gap Z and is preferably set to 32% to 34% as described above according to the present inventors.

Besides, examples of the factor of deciding the gap Z include the film thickness of the block copolymer 410 formed at Step S6 in addition to the ratio of the molecular weight of the hydrophilic polymer in the block copolymer 410. It has been confirmed by the present inventors that the film thickness is preferably set to approximately 0.4 to 0.6 times the desired pitch $L_0$ between the hydrophilic polymers 411.

Figure 17:
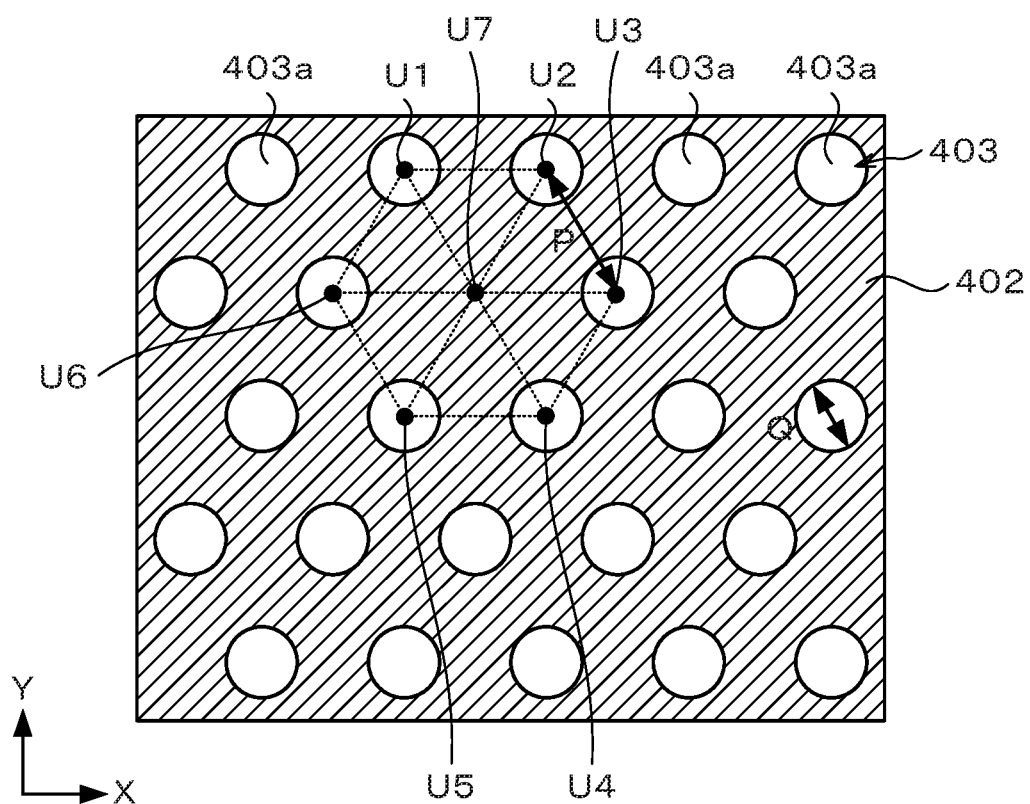
FIG. 17 An explanatory view of a planer view illustrating an appearance in which a resist pattern according to another embodiment is formed on the neutral layer.

Though the circular polystyrene films 404 functioning as guides are arranged in an equilateral triangle shape in the above embodiment, the arrangement of the polystyrene films 404 is not limited to the content of this embodiment when aligning the hydrophilic polymers 411 at positions corresponding to the hexagonal close-packed structure in a plan view. For example, as illustrated in FIG. 17, even in the case where the polystyrene film 404 is not formed, for example, at a coordinate U7 of seven adjacent coordinates U1 to U7 constituting the hexagonal close-packed structure by lacking the hole portion 403a at the coordinate U7 located at the center of them, when the block copolymer 410 is phase-separated at Step S7, the hydrophilic polymers 411 align at the desired pitch $L_0$ at positions corresponding to the hexagonal close-packed structure similarly to the case illustrated in FIG. 11. This is because by setting the ratio of the molecular weight of the hydrophilic polymer 411 in the block copolymer 410 to about 20% to 40%, the hydrophilic polymers 411 adjacent to each other autonomously phase-separates and align at equally spaced positions, namely, at positions stable in energy.

Figure 18:
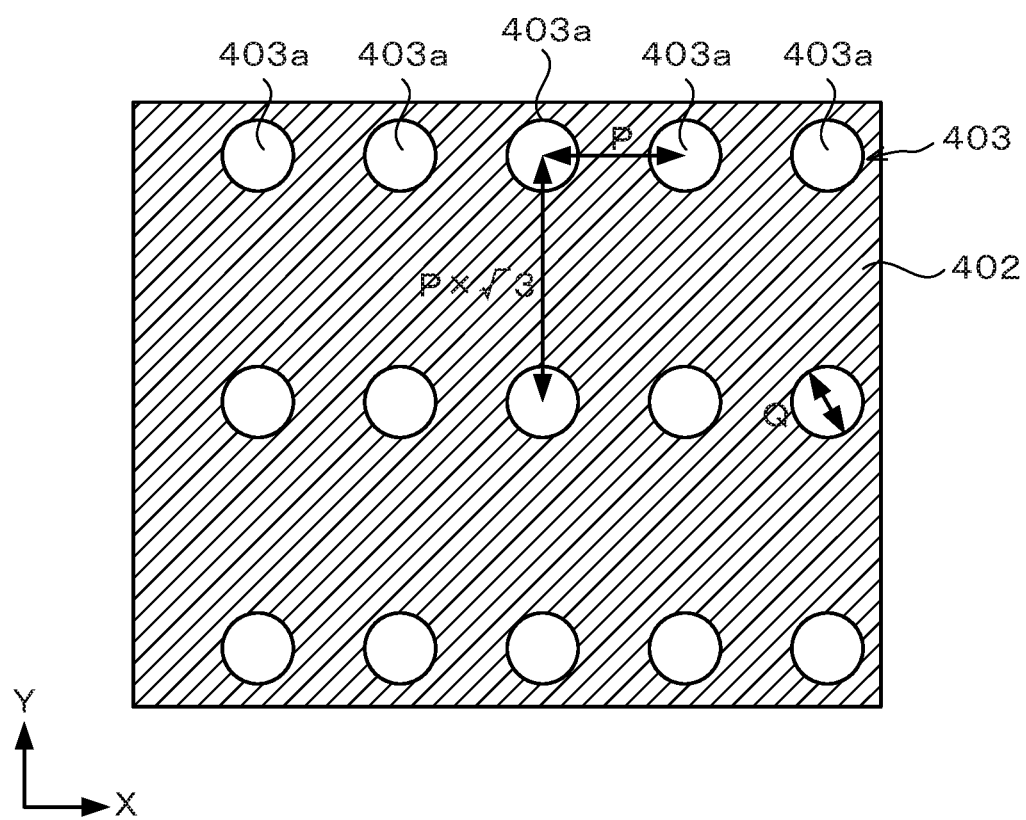
FIG. 18 An explanatory view of a planer view illustrating an appearance in which a resist pattern according to another embodiment is formed on the neutral layer.

Similarly, even if the polystyrene films 404 are formed according to, for example, a square pattern made by setting the pitch between the hole portions 403a adjacent in a Y-direction to √3 times the pitch P between the hole portions 403a adjacent in an X-direction as illustrated in FIG. 18 by lacking all of the hole portions 403a aligning in the X-direction to which the coordinate U7 in FIG. 17 belongs, the hydrophilic polymers 411 align in the hexagonal close-packed structure state as in the case illustrated in FIG. 11. Accordingly, for aligning the hydrophilic polymers 411 at the desired pitch $L_0$ at positions corresponding to the hexagonal close-packed structure, it is only necessary to set the pitch P between the closest adjacent hole portions 403a to twice the desired pitch $L_0$ between the hydrophilic polymers 411 and arrange at least one of the hole portions 403a on a circumference having a radius of 2√3 times the pitch $L_0$ around an arbitrary hole portion 403a.

Though the circular pattern of the polystyrene film 404 are formed on the neutral layer 401 by forming the resist pattern 403 having the hole portions 403a, then applying the polystyrene film 404 on the resist pattern 403, and then removing the resist pattern 403 in the above embodiment, the method of forming the circular patterns of the polystyrene film 404 is not limited to the content of this embodiment. For example, the patterns of the polystyrene film 404 may be formed on the neutral layer 401, by applying the polystyrene film 404 onto the neutral layer 401, then forming the resist pattern 403 above the polystyrene film 404, and etching the polystyrene film 404 using the resist pattern 403 as a mask.

Though the case of transferring the resist pattern 403 to the film to be treated E on the wafer W has been described as an example in the above embodiment, the present invention is also applicable to the case of performing etching on the wafer W and transferring a ball-shaped pattern onto the wafer W.

Though the removal of the resist pattern 403 at Step S5 and removal of the hydrophilic polymer 411 at Step S9 are performed by a so-called wet-treatment in the above embodiment, the method of removing the resist pattern 403 and the hydrophilic polymer 411 is not limited to that in this embodiment, for example, and the above-described dry etching or the like may be used. In other words, an apparatus for dry etching may be used in place of the resist removing apparatus 36 and the organic solvent supply apparatus 31 as a polymer removing apparatus.

Preferred embodiments of the present invention have been described above with reference to the accompanying drawings, but the present invention is not limited to the embodiments. It should be understood that various changes and modifications are readily apparent to those skilled in the art within the scope of the spirit as set forth in claims, and those should also be covered by the technical scope of the present invention. The present invention is not limited to the embodiments but can take various forms. The present invention is also applicable to the case where the substrate is a substrate other than the wafer, such as an FPD (Flat Panel Display), a mask reticle for a photomask or the like.

INDUSTRIAL APPLICABILITY

The present invention is useful in treating a substrate, for example, using a block copolymer containing a hydrophilic polymer having a hydrophilic property and a hydrophobic polymer having a hydrophobic property.

EXPLANATION OF CODES 1 substrate treatment apparatus
30 developing apparatus
31 organic solvent supply apparatus
32 anti-reflection film forming apparatus
33 neutral layer forming apparatus
34 resist coating apparatus
35 coating film forming apparatus
36 resist removing apparatus
37 block copolymer coating apparatus
40 thermal treatment apparatus
41 ultraviolet irradiation apparatus
42 adhesion apparatus
43 edge exposure apparatus
44 polymer separation apparatus
300 control unit
400 anti-reflection film
401 neutral layer
402 resist film
403 resist pattern
404 polystyrene film
410 block copolymer
411 hydrophilic polymer
412 hydrophobic polymer
W wafer

What is claimed is:
1. A substrate treatment method of treating a substrate using a block copolymer containing a hydrophilic polymer and a hydrophobic polymer, the substrate treatment method comprising:
a neutral layer forming step of forming a neutral layer on the substrate;
a coating film pattern forming step of forming a plurality of circular patterns of hydrophobic coating films at predetermined positions on the substrate after the neutral layer forming step, wherein the predetermined positions are based on a desired pattern which is a hexagonal close-packed structure in a plan view;
a block copolymer coating step of applying the block copolymer onto the substrate on which the circular patterns of the hydrophobic coating films are formed;
a polymer separating step of phase-separating the block copolymer into the hydrophilic polymer and the hydrophobic polymer; and
a polymer removing step of selectively removing the hydrophilic polymer from the phase-separated block copolymer,
wherein a ratio of a molecular weight of the hydrophilic polymer in the block copolymer is adjusted to 20% to 40% so that the hydrophilic polymers align at positions corresponding to the hexagonal close-packed structure in the plan view after the polymer separating step, and
wherein at the polymer separating step, a columnar first hydrophilic polymer is phase-separated on each of the circular patterns of the hydrophobic coating films and a columnar second hydrophilic polymer is phase-separated between the first hydrophilic polymers, and a diameter of the circular pattern of the hydrophobic coating film is set to $2(L_0-R)$ or less so that the first hydrophilic polymers and the second hydrophilic polymers align at the positions corresponding to the hexagonal close-packed structure in the plan view, where
$L_0$: a pitch between the first hydrophilic polymer and the second hydrophilic polymer adjacent to each other, and
R: a radius of the second hydrophilic polymer.
2. The substrate treatment method according to claim 1, wherein the ratio of a molecular weight of the hydrophilic polymer in the block copolymer is 32% to 34%.
3. The substrate treatment method according to claim 1, wherein the hydrophilic polymer is polymethyl methacrylate, and
wherein the hydrophobic polymer is polystyrene.
4. The substrate treatment method according to claim 1, wherein the hydrophobic coating film is a polystyrene film.
5. A substrate treatment method of treating a substrate using a block copolymer containing a hydrophilic polymer and a hydrophobic polymer, the substrate treatment method comprising:
a neutral layer forming step of forming a neutral layer on the substrate;
a coating film pattern forming step of forming a plurality of circular patterns of hydrophobic coating films at predetermined positions on the substrate after the neutral layer forming step, wherein the predetermined positions are based on a desired pattern which is a hexagonal close-packed structure in a plan view;
a block copolymer coating step of applying the block copolymer onto the substrate on which the circular patterns of the hydrophobic coating films are formed;
a polymer separating step of phase-separating the block copolymer into the hydrophilic polymer and the hydrophobic polymer; and
a polymer removing step of selectively removing the hydrophilic polymer from the phase-separated block copolymer,
wherein a ratio of a molecular weight of the hydrophilic polymer in the block copolymer is adjusted to 20% to 40% so that the hydrophilic polymers align at positions corresponding to the hexagonal close-packed structure in the plan view after the polymer separating step, and wherein the circular pattern of the hydrophobic coating films formed at the coating film pattern forming step is decided based on following (1) to (3):

(1) a diameter of the circular pattern of the hydrophobic coating films is 0.8 to 1.5 times a desired pitch between the hydrophilic polymers aligning after the polymer separating step;

(2) a distance between closest adjacent circular patterns of the hydrophobic coating films is twice the desired pitch; and (3) at least one of the circular patterns of the hydrophobic coating films is arranged on a circumference having a radius of $2\sqrt{3}$ times the desired pitch around the circular pattern of the hydrophobic coating films.

6. The substrate treatment method according to claim 5, wherein the ratio of a molecular weight of the hydrophilic polymer in the block copolymer is 32% to 34%.

7. The substrate treatment method according to claim 5, wherein the hydrophilic polymer is polymethyl methacrylate, and wherein the hydrophobic polymer is polystyrene.

8. The substrate treatment method according to claim 5, wherein the hydrophobic coating film is a polystyrene film.

9. A substrate treatment method of treating a substrate using a block copolymer containing a hydrophilic polymer and a hydrophobic polymer, the substrate treatment method comprising:

a neutral layer forming step of forming a neutral layer on the substrate;

a coating film pattern forming step of forming a plurality of circular patterns of hydrophobic coating films at predetermined positions on the substrate after the neutral layer forming step, wherein the predetermined positions are based on a desired pattern which is a hexagonal close-packed structure in a plan view;

a block copolymer coating step of applying the block copolymer onto the substrate on which the circular patterns of the hydrophobic coating films are formed;

a polymer separating step of phase-separating the block copolymer into the hydrophilic polymer and the hydrophobic polymer; and a polymer removing step of selectively removing the hydrophilic polymer from the phase-separated block copolymer, wherein a ratio of a molecular weight of the hydrophilic polymer in the block copolymer is adjusted to 20% to 40% so that the hydrophilic polymers align at positions corresponding to the hexagonal close-packed structure in the plan view after the polymer separating step, and wherein the circular patterns of the hydrophobic coating films formed at the coating film pattern forming step are arranged in an equilateral triangle shape having a pitch twice a desired pitch between the hydrophilic polymers aligning after the polymer separating step.

10. The substrate treatment method according to claim 9, wherein the ratio of a molecular weight of the hydrophilic polymer in the block copolymer is 32% to 34%.

11. The substrate treatment method according to claim 9, wherein the hydrophilic polymer is polymethyl methacrylate, and wherein the hydrophobic polymer is polystyrene.

12. The substrate treatment method according to claim 9, wherein the hydrophobic coating film is a polystyrene film.

* * * * *